United States Patent [19]

Masui et al.

[11] Patent Number: 4,983,252

[45] Date of Patent: Jan. 8, 1991

[54] PROCESS FOR PRODUCING PRINTED CIRCUIT BOARD

[75] Inventors: Katsue Masui, Hyogo; Isao Kobayashi, Kanagawa; Shigeru Kubota; Toshimoto Moriwaki, both of Hyogo, all of Japan

[73] Assignee: Mitsubishi Denki Kabushiki Kaisha, Tokyo, Japan

[21] Appl. No.: 335,827

[22] Filed: Apr. 10, 1989

[30] Foreign Application Priority Data

Apr. 13, 1988 [JP] Japan ................... 65-90609
Aug. 22, 1988 [JP] Japan ................... 63-207716

[51] Int. Cl.$^5$ .......................... C23F 1/02; B44C 1/22; C03C 15/00; C03C 25/06

[52] U.S. Cl. ........................................ 156/630; 29/846; 29/852; 156/634; 156/656; 156/659.1; 156/660; 156/666; 156/902; 156/904; 204/14.1; 427/43.1; 427/53.1; 427/96; 430/296; 430/313; 430/318

[58] Field of Search .............. 156/629, 630, 633, 634, 156/656, 659.1, 666, 902, 904; 174/68.5; 29/846, 852; 427/43.1, 53.1, 96, 97; 428/601, 137, 209, 901; 430/296, 313, 318; 204/14.1, 23, 59 R, 59 F, 72

[56] References Cited

U.S. PATENT DOCUMENTS

| | | | |
|---|---|---|---|
| 3,535,137 | 10/1970 | Haller et al. | 156/904 X |
| 3,794,510 | 2/1974 | Scala et al. | 156/904 X |
| 4,521,262 | 6/1985 | Pellegrino | 156/150 |
| 4,666,818 | 5/1987 | Lake et al. | 430/329 X |
| 4,673,457 | 6/1987 | Ishikawa et al. | 156/902 X |
| 4,698,294 | 10/1987 | Lau et al. | 156/241 X |
| 4,710,262 | 12/1987 | Weed | 156/904 X |
| 4,746,399 | 5/1988 | Demmer et al. | 156/904 X |
| 4,751,172 | 6/1988 | Rodriguez et al. | 430/329 X |
| 4,795,694 | 1/1989 | Groeber et al. | 430/329 X |

OTHER PUBLICATIONS

Shimada et al., "Application of a Positive Working Liquid Photoresist for the Internal Layer of Multilayer Printed Wiring Board," Printed Circuit World Conventiona IV, Jun. 2-5, 1987, Tokyo, Japan, pp. 1-24, WCI-V-62, "Nikkei Microdevice", Feb. 1988, p. 115.

Primary Examiner—William A. Powell
Attorney, Agent, or Firm—Wolf, Greenfield & Sacks

[57] ABSTRACT

In a process for fabricating a printed circuit board, a positive resist layer is electrodeposited on a copper clad laminate to ensure that the walls of through-holes in the substrate are completely coated with the resist, or alternatively, a film having a positive resist layer coated thereon is thermocompressed onto the copper clad laminate with the film being in contract with the latter, so as to cover both top and bottom of each through-hole. By subsequent treatments including resist exposure, development, copper foil etching and resist stripping, a high-density wiring pattern can be formed on the substrate in a uniform and consistent way even if through-holes exist in the substrate.

15 Claims, No Drawings

PROCESS FOR PRODUCING PRINTED CIRCUIT BOARD

BACKGROUND OF THE INVENTION

The present invention relates to a process by which a printed circuit board having a high-density wiring pattern can be produced efficiently in a short period of time.

A conventional process for producing a printed circuit board comprises the following steps: cutting necessary holes through a copper clad laminate and plating the walls of the through-holes; applying an etching resist over the areas where a circuit pattern is to be made; performing exposure and development of the resist; and stripping the unnecessary portions of the resist. More recently, in order to cope with the demand for increasing the density of circuit patterns to be produced, attempts have been made to pattern etching resists by a photomechanical process. There are two types of photoresist that are used as etching resists in a photomechnical process, and they are negative and positive. A negative photoresist becomes less soluble in the solvent (developer) in exposed areas relative to unexposed areas. The solvent-soluble component in a negative photoresist undergoes cross-linking by absorbing the energy of actinic radiation and thus becomes insoluble in the solvent. The cross-linked and insoluble portions of the resist are still prone to swelling in the solvent and hence can cause a problem when a high-density wiring pattern is to be obtained from the patterned photoresist. Another problem with negative resists is their vulnerability to dirt or dust particles on the mask or flaws in its surface; the area affected with these troubles remains unexposed and by subsequent development and etching, the wiring pattern in that area will become interrupted. Interruptions of the wiring pattern may also occur in through-holes which are inaccessible by actinic radiation. A positive resist is made of a polymer that is inherently insoluble in the solvent and which becomes soluble upon exposure to actinic radiation. Because of this nature, a positive resist will not swell during development with the solvent, which is a great advantage for the purpose of producing a fineline pattern. Even if dirt or dust particles of surface flaws prevent exposure, the unexposed area will remain intact during subsequent development and etching and may be retouched by another cycle of etching. The problem with inaccessible through-holes is also absent from a positive resist.

A photomechanical process involves the step of preparing a negative mask which is complementary to the pattern of etching resist to be produced and this preliminary step has been one of the causes of inefficient fabrication of printed circuit boards.

Applications of a positive photoresist to the manufacture of printed circuit boards are described in such references as Printed Circuit World Convention III, Technical Paper, 23 (1984), Printed Circuit World Convention IV, 62 (1987), and Nikkei New Materials, Jan. 5, 1987, pp. 10–11.

Methods of resist patterning by scanning with laser light are described in such references as Electronics, 32 (11), 17–19 (1986), Electron Pack. Prod., 25 (6), 64–68 (1985), and Printed Circuit World Convention IV, 65 Technical Paper, 22 (1987).

Cases in which electron beams or eximer laser light are used as light sources for exposing photoresists in the fabrication of printed circuit boards are described in such references as Laser Kagaku Kenkyu (Study of Laser Science), No. 8, 111 (1986), and Nikkei Microdevices, February, 1988, 115.

Negative masks have been necessary when conventional positive resists are used. When a laser beam is used as exposing light for patterning, a negative resist must be employed but this is not suitable for the purpose of fabricating printed circuit boards with a high-density wiring pattern within a short period of time. Conventional negative and positive resists are sensitive to ordinary light and must be handled under safety light. Not only does this require an extra capital investment but also the safety light which is yellow or red increases the burden on the operating personnel.

Electron beams are commonly used to cure paint films. When electron beams are used as a light source for exposing photoresists, they have a sufficient energy to cut the backbone chain of vinyl polymers, thereby forming positive resists from those polymers. Another advantage of electron beams is their scanning capability. An eximer laser is another source of light that has a sufficient energy to cleave the backbone chain of vinyl polymers. It is also capable of scanning the substrate during exposure by moving the substrate carrying stage for successive shots. Both electron beams and eximer laser light are actinic radiations that have short wavelengths, so that materials that are sensitive to these kinds of light can be handled under ordinary light. However, the resists that have conventionally been used in the step of exposure in the fabrication of printed circuit boards using either electron beams or eximer laser beams as exposing light are of a negative acting type and hence are not suitable for the purpose of producing a fineline pattern.

SUMMARY OF THE INVENTION

An object, therefore, of the present invention is to provide a process by which printed circuit boards having a high-density wiring pattern can be produced uniformly and consistently within a short period of time even in the presence of through-holes in the substrates.

In accordance with one aspect of the present invention, there is provided a process which comprises the steps of: electrodepositing a positive photoresist on a copper clad laminate; forming a resist pattern by exposure to actinic radiation; and forming a conductor circuit pattern by etching the surface of the copper clad laminate with said resist pattern being used as an etching resist. By exposing a positive resist to actinic radiation in forming a conductor circuit pattern, the walls of through-holes that may be cut through the substrate are entirely coated with the photoresist and incomplete entrance of the photoresist into the through-holes can be prevented, thus, attaining the intended object of the present invention. In addition, this process does not employ a negative mask, so that the step of a negative mask involving step is precluded to shorten the time required to form a desired pattern.

In accordance with another aspect of the present invention, there is provided a process which comprises the steps of: coating a positive resist layer on a film and thermocompressing the film onto a copper clad laminate with the positive resist layer contacting the latter; exposing said resist to actinic radiation; stripping said film; removing the exposed resist to form a resist pattern; and forming a conductor circuit pattern by etching the surface of the laminated substrate with said resist pattern being used as an etching resist. By thermocompressing the film onto the copper clad laminate in such a way that the positive resist layer is in contact with the substrate, the resist tents, or covers, both top and bottom of through-holes that may be cut through the substrate. This also serves to attain the intended object of the present invention.

DETAILED DESCRIPTION OF THE INVENTION

The two methods of the present invention for producing a printed circuit board according to the present invention are described hereinafter.

Either method starts with drilling, punching or otherwise cutting necessary holes through a copper clad laminate which is commonly employed in the manufacture of printed circuit boards, such as a glass-epoxy laminate, a glass-polyimide laminate or a paper-phenolic resin laminate, and the walls of the through-holes are provided with a metallic coat by electroless plating and/or electroplating to establish electrical conduction between the top and bottom of each through-hole. In accordance with the present invention, a positive resist is not deposited on the substrate by customary application techniques including spin coating, roller coating, dip coating and bar coating. Instead, a solution of a positive resist is first applied to a transparent film such as a polyethylene, polyethylene terephthalate or polyvinyl alcohol film and the coated solution is dried to form a positive resist layer; then, the transparent film is thermocompressed onto the copper clad laminate with the resist layer contacting the latter (i.e., lamination of a dry film). Alternatively, a resist resin is dissolved or dispersed in water and the resulting solution or dispersion is electrodeposited on the copper clad laminate. Either method is capable of preventing the incomplete entrance of the resist into through-holes which would occur if the resist were simply applied as a solution. Stated more specifically, in the lamination of a dry film the resist layer covers (tents) both the top and bottom of each through-hole, whereas in electrodeposition, the walls of through-holes are entirely coated with the resist layer. Positive resists that can be used in the present invention are vinyl polymers whose backbone chain is cut by exposure under actinic radiation. Examples of such polymers include: homopolymers of vinyl monomers such as methyl methacrylate (MMA), butyl methacrylate, acrylic acid, methacrylic acid, acrylonitrile, methacrylonitrile, methylmethacrylonitrile, isobutylene, styrene, α-methylstyrene, methylisopropenylketone, acrylamide, methacrylamide, α-cyanoethyl acrylate esters, epoxidized soybean oil, phosphate esters, α-cyanoethyl acrylate, Indene-one, p-methoxyphenyl isopropenyl ketone, hexafluorobutyl methacrylate, dimethyl tetrafluoropropyl methyl methacrylate, trichloroethyl methacrylate, trifluoroethyl methacrylate, methyl-α-chloroacrylate, ethyl-α-cyanoacrylate, ethyl-α-carboxyamide acrylate, trifluoroethyl-α-chloroacrylate and vinyl acetate; copolymers of these monomers; and a copolymer of butene-1 and sulfur dioxide (polybutene-1-sulfone, or PBS). Particularly preferred are those vinyl polymers with molecular weights ranging from $5 \times 10^3$ to $1 \times 10^6$ which satisfy the following conditions: they provide smooth-surfaced films; they can be developed with a 1,1,1-trichloroethane based solvent or an aqueous alkaline solution; they are resistant to liquid etchants such as ammonium persulfate and ferric chloride and they can be stripped at the final stage of fabrication process. With vinyl polymers having molecular weights of less than $5 \times 10^3$, smooth-surface coatings are difficult to obtain. With vinyl polymers whose molecular weight exceeds $1 \times 10^6$, problems will occur during development and resist stripping.

Naphthoquinone based resists are well known as positive-acting resists that are sensitive to ultraviolet or deep-ultraviolet radiation. They are also usable as positive resists with electron beams or eximer laser beams being used as exposing light. In order to provide improved adhesion to the copper foil on the substrate, compounds containing hetero atoms such as nitrogen and sulfur, plasticizers that serve to produce a desired film, as well as colorants and other suitable additives are desirably incorporated in naphthoquinone based resists.

Illustrative compounds that contain hetero atoms include benzothiazole, benzotriazole, benzimidazole, imidazoline, thiazoline and derivatives thereof. Illustrative plasticizers include phthalate estes, aliphatic acid esters, epoxidized soybean oil and phosphate esters. Illustrative colorants include organic dyes such as Ethyl Violet, Crystal Violet and Methylene Blue, and organic pigments such as Phthalocyanine Green.

The substrate on which one of the positive resists described above has been deposited is scanned with electron beams or light from an eximer laser on the basis of digitized data for the conductor pattern that is to be formed on a printed circuit board, thereby rendering solvent-soluble the resist in the unwanted area. Light from an eximer laser has a wavelength in the range of 200–400 nm, preferably 250–350 nm. Particularly preferred eximer lasers are XeCl, XeF and KrF lasers. After exposure, the substrate is developed by spraying with a 1,1,1-trichloroethane based solvent or an aqueous alkaline solution, so as to form a resist pattern. The substrate is then etched with this resist pattern being used as an etching resist. Thereafter, the resist is stripped to leave a conductor circuit pattern behind on the surface of the substrate.

If a laminated dry film is used, the transparent support film must be stripped from the resist layer either before or after exposure under actinic radiation.

The following examples are provided for the purpose of further illustrating the present invention but are in no way to be taken as limiting.

EXAMPLE 1

(1) Cutting holes through substrate and plating the walls of through-holes:

A glassepoxy laminate 1 mm thick that was coated on both sides with a copper foil 50 μm thick was provided with through-holes and holes for mounting electronic components. After imparting plating nuclei to the entire surface of the substrate, electroless plating and electroplating were conducted to deposit a copper film 25 μm thick on the walls of the holes.

(2) Preparation of dry film:

A hundred parts of polymethyl methacrylate (PMMA) having an average molecular weight of ca. $1 \times 10^6$ and 10 parts of dioctyl phthalate were dissolved in 50 parts of methyl ethyl ketone (MEK). The solution was coated onto a polyethylene terephthalate film 25 μm thick and dried first at room temperature for 20 minutes, then at 70° C. for 10 minutes and finally at 100° C. for 5 minutes, so as to form a resist layer in a thickness of 10 μm.

(3) Lamination of dry film:

After preheating the substrate at 80° C., the dry film prepared in step (2) was thermocompressed onto both sides of the substrate with heated (80° C.) rolls in such a way that the resist layer was in contact with the substrate. Thereafter, the polyethylene terephthalate film was stripped from the resist layer.

(4) Patterning resist layer:

The substrate was exposed to electron beams in accordance with a predetermined wiring pattern and developed with 1,1,1-trichloroethane to form a resist pattern.

(5) Forming conductor circuit pattern:

With the resist pattern used as an etching resist, a liquid etchant (ferric chloride) heated at 35°–40° C. was sprayed over the substrate surface at a pressure of 1.5 kg/cm$^2$ for 60–90 seconds. Thereafter, the resist was stripped with methylene chloride to form a wiring pattern having a feature size of 80 μm.

EXAMPLE 2

(1) Synthesizing water-dispersed paint for electrodeposition:

After purging oxygen from 380 g of deionized water with nitrogen gas, 50 g of acrylonitrile, 20 g of isobutylene, 20 g of ethyl acrylate, 5 g of methacrylamide and 1 g of sodium laurylsulfonate were added and the mixture was heated at 70° C. To the heated mixture, 0.3 g of potassium persulfate and 0.1 g of sodium hydrogensulfate, both being dissolved in 20 g of deionized water, were added and reaction was performed at 70° C. for 3 hours to prepare a water-dispersed paint for electrodeposition.

(2) Electrodepositing resist layer:

Through-holes were made in a glass-epoxy laminate as in step (1) of Example 1. Using this substrate as an anode, the pain prepared in step (1) above was electrodeposited at 50–100 volts for a period of 1–3 minutes. The deposited film was dried at 80° C. for 30 minutes to form a resist layer 10 μm thick.

(3) Resist patterning and forming conductor circuit pattern:

The resist layer was patterned as in step (4) of Example 1. Etching and resist stripping were conducted as in step (5) of Example 1 to form a wiring pattern having a feature size of 50 μm.

EXAMPLE 3

(1) Synthesizing water-dispersed paint for electrodeposition:

Dissolved oxygen was removed from 380 g of deionized water by bubbling with nitrogen gas. To the so treated water, 10 g of ethyl acrylate, 1 g of methacrylic acid and 1 g of sodium laurylsulfonate were added and the mixture was heated at 70° C. To the heated mixture, 0.1 g of potassium persulfate and 0.03 g of sodium hydrogensulfate, both being dissolved in 10 g of deionized-water, were added and reaction was performed at 70° C. for 30 minutes. To the reaction mixture, 0.3 g of potassium persulfate and 0.1 g of sodium hydrogensulfate were added; thereafter, 50 g of acrylonitrile, 30 g of isobutylene and 4 g of methacrylic acid were added dropwise over a period of 30 minutes. By subsequent reaction at 65° C. for 4 hours, a water-dispersed paint for electrodeposition was obtained.

(2) Electrodeposition, resist patterning and forming conductor circuit pattern:

Using the paint prepared in step (1), (2) and (3) of Example 2 were repeated to fabricate a printed circuit board having a feature size of 80 μm.

EXAMPLE 4

(1) Preparing dry film:

A hundred parts of a methyl methacrylate/methacrylic acid (10/2) copolymer having an average molecular weight of $2 \times 10^5$ and 15 parts of epoxidized butyl stearate were dissolved in 50 parts of MEK. Using the resulting solution, a dry film 15 μm thick was prepared by repeating step (2) of Example 1.

(2) Laminating dry film:

Holes were cut through a glass-epoxy laminate and the through-holes were plated as in step (1) of Example 1. With this substrate preheated at 80° C., the dry film prepared in step (1) above was laminated on it with rolls heated at 100° C.

(3) Resist exposure and development:

The substrate thus laminated with the dry film was illuminated under a KrF laser to give a total radiation energy of 70 mJ/cm$^2$. After the exposure, the resist was developed with a 2% aqueous solution of KOH.

(4) Etching copper foil and stripping resist layer:

After the resist patterning in step (3), the substrate was etched as in step (5) of Example 1. By subsequent resist stripping with methylene chloride, a conductor circuit pattern having a feature size of 50 μm was formed.

EXAMPLE 5

(1) Electrodepositing resist layer:

A water-dispersed paint for electrodeposition was prepared as in step (1) of Example 1. A substrate was prepared as in step (1) of Example 1. Using the paint, a resist layer was electrodeposited on the substrate as in step (2) of Example 2.

(2) Resist exposure, development, etching, resist stripping and forming wiring pattern:

The resist layer was exposed under a XeF laser to give a total radiation energy of 30 mJ/cm$^2$. Following the resist development by spraying with 1,1,1-trichloroethane, the resist was etched and stripped to form a wiring pattern having a feature size of 70 μm.

EXAMPLE 6

(1) Preparing dry film:

A commercial naphthoquinone diazide based resist (AZ 1350 of Shipley Company, Inc.) was coated on a PET film to give a thickness of 5 μm on a dry basis and dried.

(2) Laminating dry film:

A substrate having through-holes was fabricated as in step (1) of Example 1. The dry film prepared in step (1) above was laminated on this substrate with heated (100° C.) rolls.

(3) Resist patterning:

After stripping the PET film, the substrate was exposed to electron beams in accordance with a predetermined wiring pattern and subsequently developed with an aqueous solution of tetramethyl ammonium.

(4) Forming conductor circuit:

Using the patterned resist as an etching resist, etching was conducted as in step (5) of Example 1 to form a conductor circuit pattern.

EXAMPLE 7

(1) Preparing dry film:

A hundred parts of polybutene-1-sulfone, 5 parts of epoxidized butyl stearate and 0.5 parts of Ethyl Violet were dissolved in 100 parts of 2-methoxyethyl acetate. Using the resulting solution, step (2) of Example 1 was repeated to form a dry film 5 μm thick.

(2) Laminating dry film:

A substrate having through-holes that was fabricated as in step (1) of Example 1 was preheated at 80° C. and the dry film prepared in step (1) above was laminated on the substrate at 80° C.

(3) Resist patterning:

After stripping the support film, the dry film laminated substrate was exposed to electron beams in accordance with a predetermined wiring pattern and developed by spraying with 1,1,1-trichloroethane to form a patterned resist layer.

(4) Copper foil etching and resist stripping:

Using the patterned resist layer as an etching resist, the copper foil on the substrate was etched and the resist layer was stripped with dichloromethane to form a wiring pattern having a feature size of 30 μm.

COMPARATIVE EXAMPLE 1

A substrate having through-holes was fabricated as in step (1) of Example 1. A commercial negative dry film resist for etching was laminated on this substrate, exposed to ultraviolet rays through a negative mask, and developed to form a resist pattern having a feature size of 70 μm. This resist pattern partly separated from the substrate owing to the swelling that occurred during the development.

COMPARATIVE EXAMPLE 2

A fabricated having through-holes was fabricated as in step (1) of Example 1. A commercial negative photoresist for liquid etching was applied over the entire surface of the substrate with a roll coater. After drying, the resist layer was exposed with ultraviolet rays through a negative mask and developed to form a resist pattern. The copper foil on the substrate was etched with the patterned resist layer being used as an etching resist. Because of incomplete penetration of the resist into the through-holes and owing to incomplete exposure of the resist in the through-holes with ultraviolet radiation, the walls of the through-holes remained incompletely masked with the resist. Consequently occasional interruptions occurred in the through-holes.

The above results show that a high-density circuit pattern cannot be formed using a negative resist. Exposure to light through a negative mask has an additional obvious disadvantage in that the need to prepare the negative mask increases the time required to fabricate a printed circuit board.

As described on the foregoing pages, a process according to one aspect of the present invention comprises the steps of: electrodepositing a positive resist on a copper clad laminate; forming a resist pattern by exposure to actinic radiation; and forming a conductor circuit pattern by etching the surface of the copper clad laminate with said resist pattern being used as an etching resist. By this method, printed circuit boards having a high-density wiring pattern can be produced uniformly and consistently within a short period of time even in the presence of through-holes in the substrates.

According to another aspect of the present invention, there is provided a process which comprises the steps of: coating a positive resist layer on a film and thermocompressing the film onto a copper clad laminate with the positive resist layer contacting the latter; exposing said resist to actinic radiation; stripping said film; removing the exposed resist to form a resist pattern; and forming a conductor circuit pattern by etching the surface of the laminated substrate with said resist pattern being used as an etching resist. This method also enables printed circuit boards having a high-density wiring pattern to be fabricated uniformly and consistently within a short period of time even in the presence of through-holes in the substrates.

What is claimed is:

1. A process for producing a printed circuit board which comprises the steps of:
    depositing a positive photoresist of a vinyl polymer on a copper clad laminate thereby forming a positive resist layer;
    exposing a predetermined area of the positive resist layer to actinic radiation without a photomask and removing the exposed positive resist layer, thereby forming a photoresist pattern;
    etching copper from the surface of the copper clad liminate using the photoresist pattern as an etching resist thereby producing a conductor circuit pattern; and
    removing the non-exposed positive resist layer.

2. A process as set forth in claim 1 wherein an electron beam or a laser light is used for exposing, having a wavelength in the range of 200–400 nm, and the positive photoresist comprises a vinyl polymer with a molecular weight ranging from $5 \times 10^3$ to $1 \times 10^6$.

3. A process in accordance with claim 1 wherein the molecular weight of said vinyl polymer is 5,000–1,000,000.

4. A process in accordance with claim 1 wherein said copper clad laminate has through-holes.

5. A process for producing a printed circuit board which comprises the steps of:
    coating a polymeric positive resist layer of a vinyl polymer on a transparent or translucent film and thermocompressing the film onto a copper clad laminate with the positive photoresist layer contacting the latter;
    exposing a predetermined area of said photoresist layer to actinic radiation without a photomask;
    stripping said film;
    removing the exposed photoresist layer to form a photoresist pattern;
    etching copper from the surface of the copper clad laminate using the photoresist pattern as an etching resist; and removing the non-exposed positive resist layer.

6. A process as set forth in claim 5 wherein an electron beam or a laser light is used for exposing, having a wavelength in the range of 200–400 nm, and the positive photoresist comprises a vinyl polymer with a molecular weight ranging from $5 \times 10^3$ to $1 \times 10^6$.

7. A process in accordance with claim 5 wherein the molecular weight of said vinyl polymer is 5,000–1,000,000.

8. A process in accordance with claim 5 wherein said copper clad laminate has through-holes.

9. A process for producing a printed circuit board which comprises the steps of:
    electrodepositing a solution containing vinyl polymer on a copper clad laminate thereby forming a positive resist layer;

exposing a predetermined area of the positive resist layer to actinic radiation without a photomask thereby forming a photoresist pattern;

etching copper from the surface of the copper clad laminate using the photoresist pattern as an etching resist thereby producing a conductor circuit pattern.

10. A process for producing a printed circuit board which comprises the steps of:

depositing a positive photoresist of a vinyl polymer on a copper clad laminate;

exposing the positive photoresist to actinic radiation and developing it thereby directly forming the photoresist pattern without using negative masks;

etching copper from the surface of the copper clad laminate with the photoresist pattern being used as an etching resist; and removing the photoresist pattern thereby forming a conductor circuit pattern.

11. A process for producing a printed circuit board which comprises the steps of:

coating a positive photoresist of a vinyl polymer on a transparent or translucent film;

thermocompressing the film onto the copper clad laminate with the coated positive photoresist contacting the latter;

exposing the positive photoresist to actinic radiation and developing it thereby directly forming a photoresist pattern without using negative masks;

etching copper from the surface of the copper clad laminate with the photoresist pattern being used as an etching resist; and removing the photoresist pattern thereby forming a conductor circuit pattern.

12. A process as set forth in claim 1 wherein the step of exposing includes exposing with an electron beam or a laser light having a wavelength in the range of 200–400 nm.

13. A process as set forth in claim 12 wherein said wavelength range is in a range of 250–350 nm.

14. A process as set forth in claim 5 wherein the step of exposing includes exposing with an electron beam or a laser light having a wavelength in the range of 200–400 nm.

15. A process as set forth in claim 14 wherein said wavelength range is in a range of 250–350 nm.

* * * * *